APPARATUS FOR ASSEMBLING MODULES

Filed Dec. 21, 1955

3 Sheets-Sheet 1

Sidney K. Tally
Victor F. Dahlgren
*INVENTOR.*

May 27, 1958 S. K. TALLY ET AL 2,835,962

APPARATUS FOR ASSEMBLING MODULES

Filed Dec. 21, 1955 3 Sheets-Sheet 2

Sidney K. Tally
Victor F. Dahlgren
*INVENTOR.*

APPARATUS FOR ASSEMBLING MODULES

Filed Dec. 21, 1955 3 Sheets-Sheet 3

Sidney K. Tally
Victor F. Dahlgren
*INVENTOR.*

United States Patent Office 2,835,962

Patented May 27, 1958

2,835,962

APPARATUS FOR ASSEMBLING MODULES

Sidney K. Tally, Nashua, and Victor F. Dahlgren, West Windham, N. H.

Application December 21, 1955, Serial No. 554,464

8 Claims. (Cl. 29—203)

This invention relates generally to mounting devices for electronic components and particularly, to modules and their manufacture. More specifically, the invention relates to an apparatus for assembling modules.

Electronic circuitry and wiring has become so intricate that a great deal of attention has recently been directed to the problem of automatic manufacture. A recent innovation in this regard is the development of electronic circuit building blocks or modules which are particularly adapted to automatic manufacture. Such a module is described in an article entitled, "Project Tinkertoy," U. S. National Bureau of Standards, volume 32, Number 11, November, 1953, Technical News Bulletin. Modules of the type described comprise a plurality of congruently stacked insulating panels termed wafers. The wafers which carry electronic components are typically interconnected and supported in spaced relation by a plurality of conductors attached to the edges of the wafers and symmetrically surrounding them. These conductors are termed riser conductors or riser wires.

In the manufacture of modules of the type described, it has heretofore been extraordinarily difficult to efficiently assemble the wafers and riser conductors together.

It is therefore an object of the invention to provide an improved apparatus for assembling modules.

It is a further object of the invention to provide an improved apparatus for accurately spacing wafers in a predetermined spaced relation.

A still further object of the invention is to provide an improved trussing device for assembling modules.

Yet another object of the invention is to provide an improved apparatus for assembling modules whereby the module wafers are congruently stacked in parallel.

In accordance with the invention there is provided an apparatus for assembling modules having a plurality of stacked wafers in spaced relation and having riser conductor means attached to the wafers, each wafer having a plurality of points of junction perimetrically disposed thereon. The device comprises a planar mounting table and means affixed to the table having a plurality of spacer elements so arranged as to space the wafers in the above-mentioned spaced relation. A plurality of trussing members are slidably mounted on the table and successively pivotally connected to each other to rotate about a pivotal axis at each corner of the wafers. One of the members is adapted to support the wafers substantially perpendicular to the table. Means are provided which are affixed to the members for supporting the riser conductor means. Guide means are affixed to the table for guiding the sliding motion of the trussing members along a predetermined path, whereby the wafers engage the spacer elements and are accordingly aligned in the above-mentioned spaced relation. A clamping means is affixed to the trussing members and adapted to engage the wafers and to link the first and last members together when the members are successively rotated to surround the wafers and fix their positions relative to the riser conductor means, whereby the points of junction of the riser conductors are caused to register with the points of junction of the wafers in a predetermined connection pattern.

In accordance with the invention there is further provided a trussing device for assembling modules. The device comprises a first trussing member and a second trussing member pivotally engaged to the first member along an axis normal to the planes of the wafers of the modules. A third trussing member is pivotally engaged to the second member and a fourth trussing member is pivotally engaged to the third member along axes parallel to the above-mentioned axes. The members are adapted to be slidably mounted on a plane surface. Grooves are formed in each of the members for supporting the riser conductors of the modules parallel to the axes. A clamping bar is affixed to the first trussing member and has grooves formed therein to engage a plurality of wafers to secure them between the first and second members in spaced relation when the first member is rotated relative to the second member. Fastening means are carried by first and fourth members to link them together when the members are successively rotated to surround the wafers and fix their positions relative to the riser conductors, whereby the points of junction of the riser conductors are caused to register wth the points of junction of the wafers in a predetermined connection pattern.

For a better understanding of the present invention, together with other and further objects thereof, reference is made to the following description taken in connection with the accompanying drawings and its scope will be pointed out in the appended claims.

To prevent duplication of reference numerals the drawings are identified with numbers less than 20 and components are numbered starting with 20.

Figure 1:
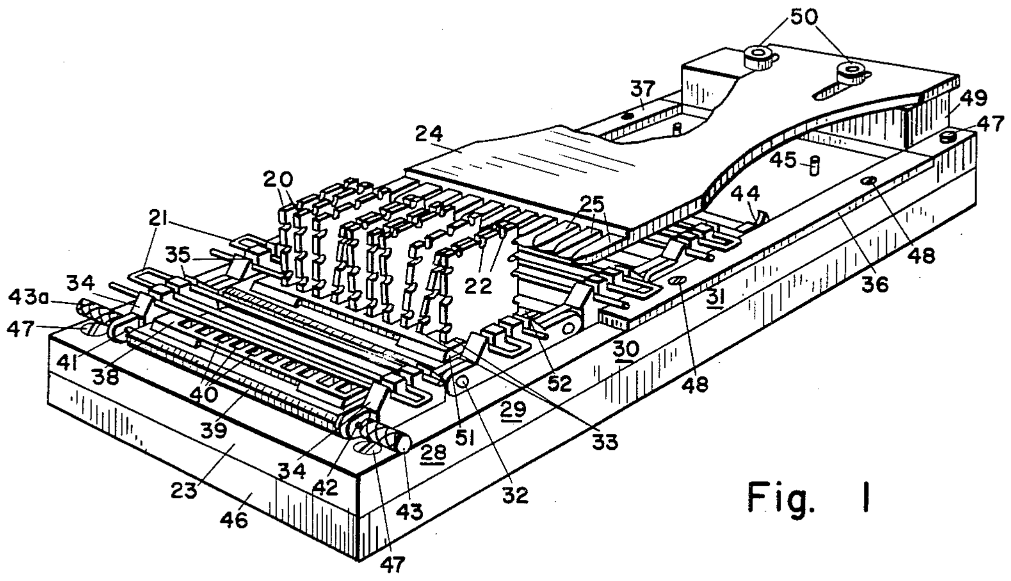
Fig. 1 is a perspective partially fragmentary view of a device for assembling modules embodying the present invention.
Figure 2:
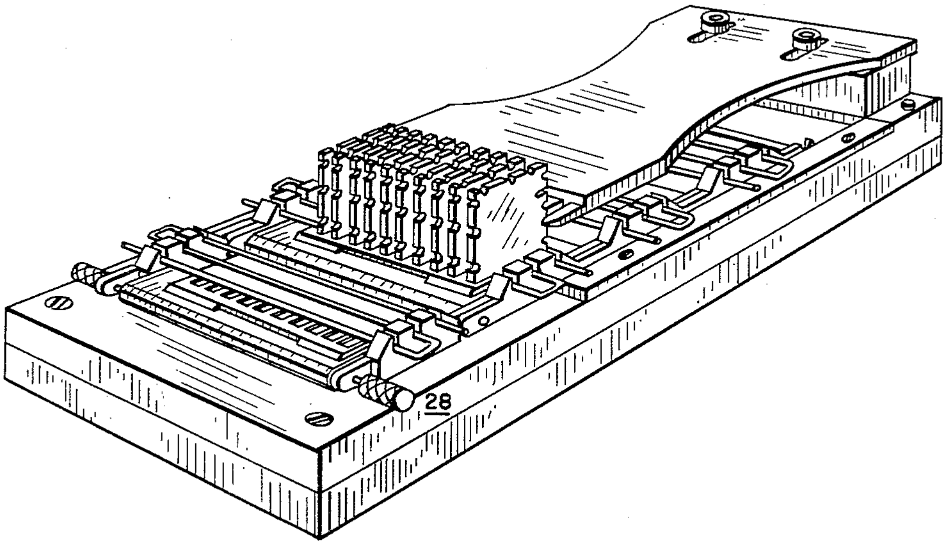
Fig. 2 is a perspective view of the device in Fig. 1 illustrating one aspect of its operation.

*Description and explanation of the apparatus in Figs. 1–6*

Referring now in more detail to the drawings and with particular reference to Figs. 1–6, inclusive, there is here illustrated an apparatus for assembling modules. The modules have a plurality of wafers 20 stacked in spaced relation and having riser conductor means, specifically riser wires 21, attached to the wafers. The wafers have a plurality of points of junction 22 perimetrically disposed as shown. The apparatus comprises a planar mounting table 23 and supporting means 24 affixed to the table and having a plurality of spacer elements 25 arranged as shown to space the wafers in the above-mentioned spaced relation.

Figure 6:
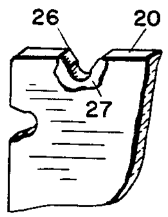
Fig. 6 is an enlarged fragmentary perspective view of a detail of a module wafer.

It will be noted that the module wafers as shown are substantially square and congruently stacked in parallel. In the completed modules the wafers are supported by a plurality of, preferably 12, symmetrically disposed riser wires 21 interconnecting electrical components, such as resistors and condensers, carried by the wafers and surrounding them. The wafers 20 have a plurality, preferably 12, of indentations 22, preferably solder-coated and symmetrically disposed as shown and coinciding with intersecting connections of the riser conductors. As shown in Fig. 6 the points of junction of a wafer 20 includes a tapered slot 26 which is filled with solder 27. A plurality of trussing members 28, 29, 30 and 31 are successively pivotally engaged along axes as defined by shafts 32 normal to the parallel planes of the flat surfaces of the wafers, as shown. It will be seen that the trussing members 28—31 are thus adapted to be slidably mounted on table 23. By virtue of the slots 33, the trussing member 29 is adapted to support the wafers 20 substantially perpendicularly to the table.

Each member of the trussing device has a pair of end elements 34 which have grooves 35 formed therein providing means associated with each of the members for supporting the riser conductors. A pair of guide bars 36 and 37 are affixed to the mounting table 23 as shown for guiding the sliding motion of the trussing members longitudinally along a predetermined path on the table 23. A clamping bar 38 is affixed to the shaft element 39 of the trussing member 28. The bar 38 has grooves 40 formed therein, thereby adapting the member 28 to engage the wafers when rotated. A movable shaft 41 is slidably mounted in the shaft element 39 and has a threaded end 42 secured with a threaded knurled nut 43. The second trussing member 29 has a pair of shaft elements 51 and 52 with slots 33 formed therein to support the wafers 22 in position as shown.

The last trussing member 31 has a pair of arcuate extensions 44 affixed to its end elements 34 as shown. When the members 28—31 are successively rotated to surround the wafers, the extensions 44 are fastened to the shaft 41 of the first trussing member 28 to provide fastening means to link the first member 28 and the last member 31 together. The clamping bar 38 and fastening means together provide a clamping means affixed to the trussing members. The clamping means is thus adapted to engage the wafers and link the first and last trussing members when the members are successively rotated. A pair of pins 45 are affixed to the table 23 to provide a stop guide means for controlling the length of travel of the trussing members along the surface of the table 23. The table as shown is affixed to a mounting plate 46 with screws 47. The guide bars 36 and 37 are affixed to the table 23 with screws 48. The supporting means 24 is carried by a block member 49 and secured to the table 23 through the block 49 with screws 50. Slots formed in the supporting means 24 enable its position to be adjusted.

*Operation*

The module is assembled by placing the trussing members in an unfolded position on the table 23 between the guide bars 36 and 37 as shown in Fig. 1. Riser wires 21, in groups of three and preferably connected together in the form of an S, as shown, are inserted in parallel in the grooves 35 of the trussing members 28—31. The module wafers 20 are inserted in the grooves 23 formed in the shaft members 51 and 52 of the second trussing member 29 so that they are stacked substantially congruently in spaced relation perpendicular to the plane of the table 23. The grooves 33 are necessarily larger than the thickness of the wafers to enable the grooves to accept wafers varying in thickness within a predetermined tolerance. The wafers are, consequently, at this phase not accurately aligned in parallel and do not have their flat sides precisely perpendicular to the table 23. The trussing members are slid along the surface of the table 23 in the direction of the guide stop means 45 until wafers 20 engage the spacer elements 25 and are accurately aligned in parallel spaced relation in the manner represented in Fig. 2. The spacer elements are preferably linearly disposed below the lateral center line of the wafers to preclude advertent ejection of the wafers 20 from the slots 33. If the spacer elements 25 are located above the center line of the wafers, engagement with the clamping bar 38 is more readily effected since more accurate wafer alignment occurs. In some cases it may be desirable to utilize two sets of spacer elements arranged both above and below the center line.

Figure 3:
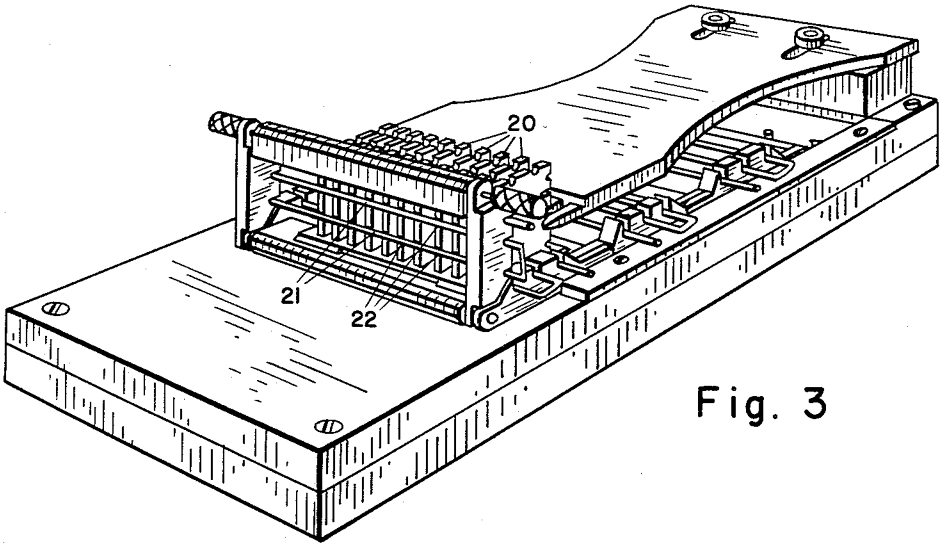
Fig. 3 is a perspective view of a device in Fig. 1 illustrating a further aspect of its operation.
Figure 4:
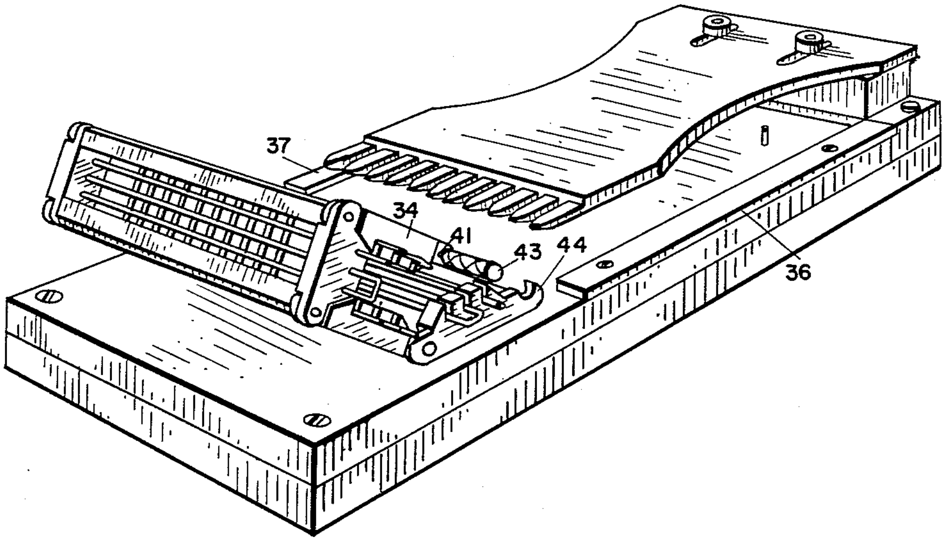
Fig. 4 is a perspective view of the device in Fig. 1 illustrating a still further aspect of its operation.
Figure 5:
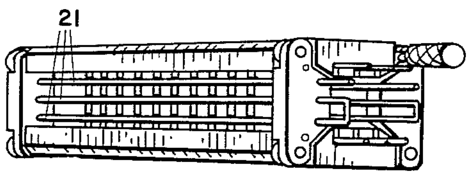
Fig. 5 is a perspective view of a trussing device embodying the invention.

The first trussing member 28 is then rotated to enable the clamping bar 38 affixed thereto to engage the wafers and secure them between the first member 28 and the second member 29 in spaced relation as shown in Fig. 3. As member 28 is rotated into this position, the riser wires 21 carried by the trussing member 28 are inserted into the grooves 22 formed in the wafers. All of the trussing members are then withdrawn from the spacer elements 25, with the members 28 and 29 holding the wafers in position, and successively rotated to surround the wafers as shown in Fig. 4 and to affix riser wires to all sides of the wafers. The arcuate extensions 44 are placed in contact with the shaft 41 of the first trussing member 28. One of the extensions 44 engages the shaft 41 between the end elements 34 and the knurled nut 43; the other extension 44 is inserted between the shaft member 39 and the other end element 34. The knurled nut is rotated until the members 28 and 31 are securely linked together. The module wafers are thus fixed relative to the riser conductor means so that the points of junction of the riser conductors register with the points of junction of the wafers in a predetermined connection pattern as shown in Fig. 5. It will be seen that the trussing device bundles the module wafers and riser wires into a form by which solder-dipping in the well-known manner to effect the connections between the points of junction of wafers and riser wires may be readily accomplished. The wafers, trusses, and riser wire may then be dipped in solder to affix the riser wires to the wafers and form the module of stacked wafers. When the solder has solidified, the trusses may be unwrapped and the module removed.

*Modifications*

Figures 7, 8:
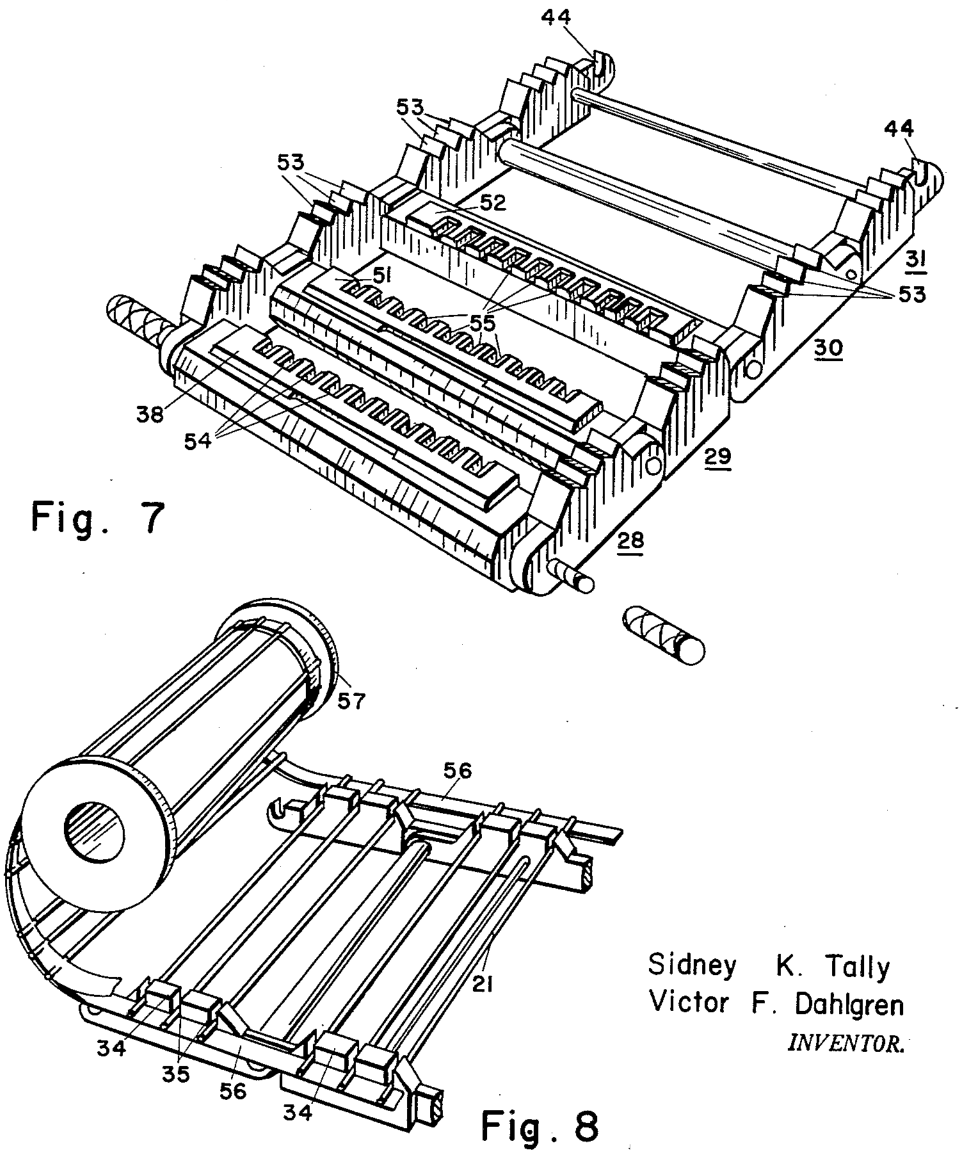
Fig. 7 is a perspective view of a modification of the trussing device of Fig. 5.
Fig. 8 is an enlarged perspective view of a part of the device in Fig. 7.

In Fig. 7 there is shown a modification of the trussing device in which the end members are serrated to form tapered grooves 53 for supporting the riser wires 21 (not shown in Fig. 7) in parallel. Since this device is generally similar to that of Fig. 1, corresponding elements are indicated by identical reference numerals. The clamping bar 38 has tapered grooves; similarly, the grooves 55 in the shaft elements 51 and 52 of the second trussing member 29 are tapered as shown to enhance insertion of the wafers into the grooves. In practice it has been found satisfactory to combine the clamping bar 38 having tapered grooves with locating the spacer elements 25 below the center line of the wafers 20.

As shown in Fig. 8 the riser wires 21 may be disposed between two pairs of adhesive tapes 56 and coiled into a reel 57. The wires are so disposed in the tapes as to coincide with the position of the grooves 35 in the end elements to 34 of the trussing member. The riser wires may also be disposed in this manner by linking them together with wire instead of the tape.

While applicant does not intend to be limited to any particular shape or sizes of parts in the embodiments of the invention just described, there follows a set of materials and sizes for the more important elements which have been found to be particularly suitable for the apparatus represented in Fig. 1. Thus, wafers 20 may be formed of ceramic ⅞ inch square by 1/16 inch thick and the riser wires 21 formed from #21 tinned copper wire. The spacer elements 25 may be ⅛ inch wide and spaced approximately .2 inch apart.

While there have been described what are, at present, considered to be preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. An apparatus for assembling modules having a plurality of stacked wafers in spaced relation and having riser conductor means attached to said wafers, said wafers having a plurality of points of junction perimetrically disposed, comprising: a planar mounting table; means affixed to said table having a plurality of spacer elements so arranged as to space said wafers in said spaced relation; a plurality of trussing members slidably mounted on said table and successively pivotally connected to each other and adapted to rotate about a pivotal axis associated with each corner of said wafers, one of said members being adapted to support said wafers substantially perpendicularly to said table; means affixed to each of said members for supporting said riser conductor means; guide means affixed to said table for guiding the sliding motion of said trussing members along a predetermined path whereby said wafers engage said spacer elements and are accurately aligned in said spaced relation; and a clamping means affixed to said trussing members and adapted to engage said wafers and to link the first of said members and the last of said members together when said members are successively rotated to surround said wafers and fix their positions relative to said riser conductor means whereby the points of junction of said riser conductors are caused to register with said points of junction of said wafers in a predetermined connection pattern.

2. An apparatus for assembling modules having a plurality of stacked wafers in spaced relation and having riser conductor means attached to said wafers, said wafers having a plurality of points of junction perimetrically disposed, comprising: a planar mounting table; means affixed to said table having a plurality of spacer elements so arranged as to space said wafers in said spaced relation, said elements being elevated from said table less than one-half the height of one of said wafers; a plurality of trussing members slidably mounted on said table and successively pivotally connected to each other and adapted to rotate about a pivotal axis associated with each corner of said wafers, one of said members being adapted to support the flat sides of said wafers substantially perpendicularly to said table; means affixed to each of said members for supporting said riser conductor means; guide means affixed to said table for guiding the sliding motion of said trussing members along a predetermined path whereby said wafers engage said spacer elements and are accurately aligned in said spaced relation; and a clamping means affixed to said trussing members and adapted to engage said wafers and to link the first said member and the last said member together when said members are successively rotated to surround said wafers and fix their positions relative to said riser conductor means whereby the points of junction of said riser conductors are caused to register with said points of junction of said wafers in a predetermined connection pattern.

3. An apparatus for assembling modules having a plurality of stacked wafers in spaced relation and having riser conductors attached to said wafers, said wafers having a plurality of points of junction perimetrically disposed, comprising: a planar mounting table; means affixed to said table having a plurality of elevated linearly aligned spacer prongs so arranged as to accurately space said wafers in said spaced relation, said prongs extending parallel to said table; a plurality of trussing members slidably mounted on said table and successively pivotally connected to each other along a pivotal axis normal to said prongs and associated with each corner of said wafers, one of said members being adapted to support the flat sides of said wafers substantially perpendicular to said table; grooves formed in each of said members for supporting said riser conductors; guide means affixed to said table for guiding the sliding motion of said trussing members along a predetermined path whereby said wafers engage said spacer elements and are accurately aligned in said spaced relation; and a clamping means affixed to said members and adapted to engage said wafers and to link the first said member and the last said member together when said members are successively rotated to surround said wafers and fix their positions relative to said riser conductors whereby the points of junction of said riser conductors are caused to register with said points of junction of said wafers in a predetermined connection pattern.

4. An apparatus for assembling modules having a plurality of substantially square wafers congruently stacked in parallel and in spaced relation and supported by a plurality of symmetrically disposed riser conductors interconnecting and surrounding said wafers, said wafers having a plurality of solder-filled indentations perimetrically disposed and coinciding with intersecting connections of said riser conductors, comprising: a planar mounting table; means affixed to said table having a plurality of spacer elements so arranged as to accurately space said wafers in said spaced relation; four trussing members slidably mounted on said table and successively pivotally connected to each other along a pivotal axis normal to said elements and associated with each corner of said wafers, one of said members being adapted to support the flat sides of said wafers substantially perpendicular to said table; grooves formed in each of said members for supporting said riser wires in parallel; guide means affixed to said table for guiding the sliding motion of said trussing members along a predetermined path whereby said wafers engage said spacer elements and are accurately aligned in said spaced relation; stop guide means affixed to said table for controlling the length of travel of said members along said path; and a clamping means affixed to said members and adapted to engage said wafers and to link the first said member and the last said member together when said members are successively rotated to surround said wafers and fix their positions relative to said riser conductor means whereby the points of junction of said riser conductors are caused to register with said points of junction of said wafers in a predetermined connection pattern.

5. An apparatus for assembling modules having a plurality of substantially square wafers congruently stacked in parallel and in spaced relation and supported by a plurality of symmetrically disposed riser conductors interconnecting and surrounding said wafers, said wafers having a plurality of solder-filled indentations perimetrically disposed and coinciding with intersecting connections of said riser conductors, comprising: a planar mounting table; means affixed to said table having a plurality of spacer elements so arranged as to accurately space said wafers in said spaced relation; a plurality of trussing members slidably mounted on said table and successively pivotally connected to each other along a pivotal axis normal to said elements and associated with each corner of said wafers, one of said members having tapered grooves to support the flat sides of said wafers substantially perpendicular to said table; tapered grooves perpendicular to the first said grooves formed in said members for supporting said riser conductors in parallel; guide means affixed to said table for guiding the sliding motion of said trussing members along a predetermined path whereby said wafers engage said spacer elements and are accurately aligned in said spaced relation; and a clamping means affixed to said members and adapted to engage said wafers to their fixed position in said spaced relation when said members are rotated and to link the first said member and the last said member together when said members are successively rotated to surround said wafers and fix their positions relative to said riser conductor means whereby the points of junction of said riser conductors are caused to register with said points of junction of said wafers in a predetermined connection pattern.

6. A trussing device for assembling modules, comprising: four trussing members successively pivotally connected to each other and adapted to rotate about a pivotal axis associated with each corner of the wafers of said modules, each of said members having a pair of spaced, riser conductor elements with riser grooves formed in each of said elements for supporting the module riser conductors parallel to the axes of pivot of said members; a clamping bar affixed to the first of said trussing members and having wafer grooves perpendicular to said riser grooves to engage a plurality of wafers and secure them between the first and second of said members in spaced relation when said first member is rotated relative to said second member; and fastening means carried by the first and fourth of said members to link them together when said members are successively rotated to surround said wafers and fix their position relative to said riser conductors whereby the points of junction of the riser conductors are caused to register with the points of junction of said wafers in a predetermined connection pattern, said points of junction being exposed to enable ready soldering.

7. A trussing device for assembling modules having a plurality of stacked wafers in spaced relation with perimetrically disposed indentations and having supporting riser conductors inserted in said indentations, comprising: four trussing members successively pivotally connected to each other and adapted to rotate about a pivotal axis associated with each corner of said wafers, each of said members having a pair of spaced riser conductor supporting elements with riser grooves formed in each of said elements for supporting said riser conductors parallel to the axes of pivot of said members, and the second of said trussing members having a pair of spaced, wafer-supporting elements with wafer-supporting grooves in said elements perpendicular to said riser grooves for supporting along one narrow side said wafers substantially perpendicularly; a clamping bar affixed to the first of said trussing members with spaced right angle notches formed perpendicular to said riser grooves, thereby adapting said device to temporarily lock said wafers in position by engaging an adjacent narrow side and an opposite narrow side of said wafers when said first member is rotated relative to said second member; and fastening means carried by the first and fourth of said members to link them together when said members are successively rotated to fix the riser conductors in position in said wafer indentations and surround said wafers and riser conductors to lock them together with the points of junction of said riser conductors and said wafers being exposed to enable ready soldering.

8. An apparatus for assembling modules having a plurality of stacked wafers in spaced relation and having riser conductor means attached to said wafers, said wafers having a plurality of points of junction perimetrically disposed, comprising: a planar mounting table; means affixed to said table having a plurality of elevated, spacer elements so arranged as to space said wafers in said spaced relation; a plurality of trussing members successively pivotally connected to each other about a pivotal axis associated with each corner of said wafers and slidably mounted on said table and adapted to slide under said spacer elements, one of said members being adapted to support said wafers substantially perpendicularly to said table; means affixed to each of said members for supporting said riser conductor means; guide means affixed to said table for guiding the sliding motion of said trussing members along a predetermined path whereby said wafers engage said spacer elements and are accurately aligned in said spaced relation; and a fastening means affixed to said trussing members and adapted to engage said wafers and to link the first of said members and the last of said members together when said members are successively rotated to surround said wafers and fix their positions relative to said riser conductor means whereby the points of junction of said riser conductors are caused to register with said points of junction of said wafers in a predetermined connection pattern.

References Cited in the file of this patent

UNITED STATES PATENTS

| | | |
|---|---|---|
| 1,456,506 | Leveridge | May 29, 1923 |
| 1,825,481 | Shindledecker | Sept. 29, 1931 |